(12) United States Patent
Humphrey

(10) Patent No.: US 6,509,757 B1
(45) Date of Patent: Jan. 21, 2003

(54) BINARY WEIGHTED THERMOMETER CODE FOR PVT CONTROLLED OUTPUT DRIVERS

(75) Inventor: Guy Harlan Humphrey, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/921,025

(22) Filed: Aug. 2, 2001

(51) Int. Cl.$^7$ ........................................ H03K 19/0185
(52) U.S. Cl. ........................ 326/30; 326/87; 326/32
(58) Field of Search .................. 326/30, 32, 86, 326/87

(56) References Cited

U.S. PATENT DOCUMENTS 5,955,894 A * 9/1999 Vishwanthaiah et al. ...... 326/86
6,118,310 A    9/2000 Esch, Jr.
6,326,802 B1 * 12/2001 Newman et al. .............. 326/30

* cited by examiner

Primary Examiner—Michael Tokar
Assistant Examiner—Anh Q. Tran (57) ABSTRACT

A binary weighted thermometer code is employed to adjust the output impedance of a variable impedance output driver circuit. The driver circuit includes an impedance network comprising a plurality of resistive devices each programmably electrically connectable in parallel between a first voltage source and the signal pad. The resistive devices are partitioned into a plurality of sets. A first set of the resistive devices may be programmed in a binary incremental manner to electrically connect one or more of the resistive devices in the first set between the first voltage source and the signal pad. Only if all of the resistive devices in the first set are activated may a second set of the resistive devices be programmed in a binary incremental manner. Additional sets of the resistive devices may be likewise programmed only after all of the resistive devices in the previously programmed sets are activated.

17 Claims, 6 Drawing Sheets

BINARY WEIGHTED THERMOMETER CODE FOR PVT CONTROLLED OUTPUT DRIVERS

FIELD OF THE INVENTION

The present invention pertains generally to variable impedance output drivers in integrated circuits, and more particularly to a binary weighted thermometer code for controlling the output impedance of integrated circuit output drivers due to variations in manufacturing process, voltage, and temperature.

BACKGROUND OF THE INVENTION

Integrated circuits are commonly packaged as chips. An integrated circuit within a chip communicates with the world outside the chip through metalization layers on the outside of the chip known as signal pads. In order for an integrated circuit within the chip package to send signals outside of the chip, "driver circuits" drive signals onto the signal pads on the exterior of the chip. The signal pads of various chips are connected together by transmission lines known as signal traces, thereby allowing communications between different chips.

The signal pads on a chip are connected to the packaging of the chip (e.g., a pin) which is then connected to a signal trace on a printed circuit board which runs to another integrated circuit chip or electronic device. The electrical connection of the signal pad through the packaging of the chip to the signal trace is characterized by parasitic resistance, inductance, and capacitance which interferes with the transmission of the signal from the signal pad. The transmission line characteristics of the printed circuit board signal trace itself, including parasitic resistance, capacitance, and inductance, also interfere with the quality of the transmission of the signal from the signal pad. All of the foregoing add to the load impedance which must be driven by the output driver circuit.

Due to the parasitic resistance, capacitance, and inductance which is present on chip-to-chip signal interconnections, the driver circuits that drive those signal interconnections are preferably designed to avoid excessive voltage swings when switching occurs (particularly for high speed or low power I/O). Excessive voltage swings are known as ringing. Ringing must be avoided while still switching as fast as possible to meet the high speed performance requirements of modern integrated circuits.

As known by those skilled in the art, it is important to match the output impedance of a given signal driver to the characteristic impedance of the transmission line it drives in order to avoid signal reflections due to voltage level switching on the pad, and therefore undesirable signal degradation.

Matching the impedance of an output driver to the characteristic impedance of the signal transmission line is problematic for several reasons. First, process variations inherent in the manufacturing process of integrated circuits, such as the transistor implanting doping level, the effective length of channels in the field effect transistors (FETs), the thickness of the gate oxide for transistors, and the diffusion resistance, can cause the output impedance of two supposedly identical circuits to differ. In particular, variations in any or all of the above process parameters can cause different integrated circuits intended to perform the same function to be classified as "slow", "nominal", or "fast". In other words, two supposedly identical integrated circuits can vary in any or all of the process parameters. As these parameters approach the fast case, the resistance of many components within a chip is decreased. In the opposite extreme, as the process parameters stray further and further from the ideal case, the performance of the chip is degraded, specifically, the resistance of the many components within the chip is increased. This situation is referred to as the "slow" case.

In addition, variations in voltage and temperature can cause variations in the output impedance of a given chip. Specifically, the driver output impedance can vary significantly between variations in the operating voltage even within a small operating voltage tolerance range. In another example, when the temperature of an integrated circuit approaches its maximum operating temperature, the resistance of the integrated circuit components increases.

In view of the above, variable impedance output drivers have been developed to allow adjustment of the driver output impedance due to variations in manufacturing process, voltage, and temperature.

One prior art technique for accomplishing impedance matching of output pads for integrated circuits is described in U.S. Pat. No. 6,118,310 to Esch, Jr. and assigned to the same assignee of interest, entitled "Digitally Controlled Output Driver and Method for Impedance Matching", herein incorporated by reference for all that it teaches. In the technique described therein, output driver impedance matching is accomplished by programmably enabling a combination of FETs arranged in parallel whose combined impedance closely matches the characteristic impedance of the transmission line.

Such prior art variable impedance output drivers typically use a pure thermometer code for the PVT impedance matching control in order to limit the change in output impedance when the PVT control code is updated. In particular, the impedance networks implement a "thermometer" code whereby when an nth-order signal $W_n$ is activated (set to "1") all of the lower-order signals $W_1$ to $W_{n-1}$ are also activated. In a pure thermometer code impedance matching circuit, a first FET leg is activated and then each subsequent FET leg is activated until the desired output impedance is achieved. Accordingly, at least one leg is always activated to ensure that during the switching of FET legs on or off, the FET legs are never switched from all off to all on or vice versa, which would result in a spike in the output impedance. Table 1 illustrates a pure 11-bit thermometer code, wherein each bit 0::10 in the code word W represents an incremental admittance step of 10%.

TABLE 1

| $W_0$ | $W_1$ | $W_2$ | $W_3$ | $W_4$ | $W_5$ | $W_6$ | $W_7$ | $W_8$ | $W_9$ | $W_{10}$ | Admittance (Y = 1/Z) | Impedance (Z) |
|---|---|---|---|---|---|---|---|---|---|---|---|---|
| 1 | 0 | 0 | 0 | 0 | 0 | 0 | 0 | 0 | 0 | 0 | 1 | 1 |
| 1 | 1 | 0 | 0 | 0 | 0 | 0 | 0 | 0 | 0 | 0 | 1 + .1 | .909 |
| 1 | 1 | 1 | 0 | 0 | 0 | 0 | 0 | 0 | 0 | 0 | 1 + .2 | .833 |

TABLE 1-continued

| $W_0$ | $W_1$ | $W_2$ | $W_3$ | $W_4$ | $W_5$ | $W_6$ | $W_7$ | $W_8$ | $W_9$ | $W_{10}$ | Admittance (Y = 1/Z) | Impedance (Z) |
|---|---|---|---|---|---|---|---|---|---|---|---|---|
| 1 | 1 | 1 | 1 | 0 | 0 | 0 | 0 | 0 | 0 | 0 | 1 + .3 | .769 |
| 1 | 1 | 1 | 1 | 1 | 0 | 0 | 0 | 0 | 0 | 0 | 1 + .4 | .714 |
| 1 | 1 | 1 | 1 | 1 | 1 | 0 | 0 | 0 | 0 | 0 | 1 + .5 | .667 |
| 1 | 1 | 1 | 1 | 1 | 1 | 1 | 0 | 0 | 0 | 0 | 1 + .6 | .625 |
| 1 | 1 | 1 | 1 | 1 | 1 | 1 | 1 | 0 | 0 | 0 | 1 + .7 | .588 |
| 1 | 1 | 1 | 1 | 1 | 1 | 1 | 1 | 1 | 0 | 0 | 1 + .8 | .555 |
| 1 | 1 | 1 | 1 | 1 | 1 | 1 | 1 | 1 | 1 | 1 | 1 + .9 | .526 |

In illustrated in the example thermometer code of TABLE 1, the controllable range of sensitivity of output impedance is limited to between 1 and 0.526, wherein the admittance is changed by 0.1 or 10% for each step. As also illustrated by TABLE 1, a pure thermometer code requires one bit for each step. Accordingly, one of the drawbacks of a pure thermometer code is the large number of bits (and therefore control lines) required to allow a large range of output impedance. The number of control lines increases exponentially as the degree of required step sensitivity increases. For example, if it would be desirable to step the admittance only 1% in order to increase the sensitivity of each step, the PVT control circuit would require 101 control lines, or tenfold the number of lines required for adjusting it to the nearest 10%. Alternatively, if it were desired to increase the range of adjustable output impedance from 1 to 0.25, in the example of TABLE 1 with each step changing the admittance by 10%, an additional twenty bits (control lines) would be required.

Accordingly, although an increased sensitivity range for adjusting the PVT output impedance is desirable, the number of bits required to implement any significant range of sensitivity using a pure thermometer code is outweighed by the added design complexity and chip real estate required to implement it.

An alternative solution to the problems inherent with a pure thermometer code is the use of a pure binary weighted code whereby each leg of the PVT control circuit comprises a resistive device having an admittance corresponding to a combination of its binary weighted bit position. In other words, each leg has an admittance of $2^{(bit\ position)}Y$, where Y is a predefined minimum admittance appropriate to the design. In accordance with the binary weighted code, if bit 0 of the calibration word controls a FET with admittance Y, bit 1 of the calibration word controls a FET with admittance 2*Y, bit 2 of the calibration word controls a FET with admittance 4*Y, and so on. In effect, as the calibration word binary count increments, more resistors are added in parallel in the driver FET array, and the output impedance $Z_{OUT}$ drops. TABLE 2 illustrates an example binary weighted code.

TABLE 2

| $W_0$ | $W_1$ | $W_2$ | $W_3$ | Admittance (Y = 1/Z) | Impedance (Z) |
|---|---|---|---|---|---|
| 0 | 0 | 0 | 0 | 0 | infinite |
| 1 | 0 | 0 | 0 | 0.1 | 10 |
| 0 | 1 | 0 | 0 | 0.2 | 5 |
| 1 | 1 | 0 | 0 | 0.3 | 3.333 |
| 0 | 0 | 1 | 0 | 0.4 | 2.5 |
| 1 | 0 | 1 | 0 | 0.5 | 2 |
| 0 | 1 | 1 | 0 | 0.6 | 1.667 |

TABLE 2-continued

| $W_0$ | $W_1$ | $W_2$ | $W_3$ | Admittance (Y = 1/Z) | Impedance (Z) |
|---|---|---|---|---|---|
| 1 | 1 | 1 | 0 | 0.7 | 1.429 |
| 0 | 0 | 0 | 1 | 0.8 | 1.25 |
| 1 | 0 | 0 | 1 | 0.9 | 1.111 |
| 0 | 1 | 0 | 1 | 1.0 | 1 |
| 1 | 1 | 0 | 1 | 1.1 | .909 |
| 0 | 0 | 1 | 1 | 1.2 | .833 |
| 1 | 0 | 1 | 1 | 1.3 | .769 |
| 0 | 1 | 1 | 1 | 1.4 | .714 |
| 1 | 1 | 1 | 1 | 1.5 | .667 |

As illustrated in TABLE 2, the benefit of using a binary weighted code is its ability to achieve a larger range of output impedance using fewer bits (or PVT control lines). However, in a pure binary weighted code, a step-wise increment does not ensure that all legs currently activated will remain activated at the next step. For example, suppose the current binary weighted calibration code is a binary 1110 (corresponding to an admittance of 0.7) and the code is to be incremented to binary 0001 (corresponding to an admittance value of 0.8). When the electrical connections are switched from 1110 to 0001, it is possible that for a very short time the switches may be in a state such that all the FETs will be off or all the FETs will be on (corresponding to a PVT code of 1111 or 0000 respectively). This can result in an undesirable spike in the output impedance seen on the signal pad. (In this example and according to TABLE 2, the output impedance could momentarily change from $Z_{OUT}$=1.429 (corresponding to an admittance of 0.7) to $Z_{OUT}$=0.667 (corresponding to an admittance of 1.5 (all 1s), or from $Z_{OUT}$=1.429 (corresponding to an admittance of 0.7) to $Z_{OUT}$=infinite (corresponding to an admittance of 1.5) (all 0s).

Accordingly, a need exists for a PVT control encoding technique that allows for a higher output impedance range with fewer control lines, while preventing spikes in the output impedance on the signal pads.

SUMMARY OF THE INVENTION

The present invention is a novel variable impedance output driver control circuit and method for programming the same that employs a binary weighted thermometer code when adjusting the output impedance of an output driver to take into account variations in process, voltage, and temperature across functionally identical chips. The coding scheme of the invention achieves a high range of sensitivity with a minimal number of PVT control lines while preventing spikes in the output impedance on the signal pad.

In accordance with one embodiment of the invention, a binary weighted thermometer code is employed in a variable impedance output driver control circuit to variably adjust the output impedance of an output driver circuit. The variable impedance output driver control circuit is configured with a plurality of resistive devices each programmably electrically connectable in parallel between a first voltage source and the signal pad. The plurality of resistive devices are partitioned into a plurality of sets whereby a first set of the resistive devices may be programmed in a binary incremental manner to electrically connect one or more of the resistive devices in the first set between the first voltage source and the signal pad. Only after all of the resistive devices in the first set have been electrically connected between the first voltage source and the signal pad may a second set of the resistive devices be programmed in a binary incremental manner to electrically connect one or more of the resistive devices in the second set between the first voltage source and the signal pad. Additional sets of the resistive devices may be likewise programmed whereby only after all of the resistive devices in the previously programmed sets have been electrically connected between the first voltage source and the signal pad may an additional set of the resistive devices be programmed in a binary incremental manner to electrically connect one or more of the resistive devices in the additional set between the first voltage source and the signal pad. Preferably, at least one of the resistive devices is electrically connected between the first voltage source and signal pad at all times to prevent an output impedance spike on the signal pad. Additionally, each respective set of the resistive devices preferably implements a pure binary weighted code to increase the output impedance range within the respective set.

In accordance with another embodiment of the invention, a control circuit for a variable impedance output driver circuit includes a first set of resistive devices programmably electrically connectable between a first voltage source and the signal pad, a second set of resistive devices programmably electrically connectable between the first voltage source and the signal pad, and a controller which programs in a binary incremental manner electrical connection of the first set of said resistive devices between the first voltage source and signal pad and which programs in a binary incremental manner electrical connection of the second set of resistive devices between the first voltage source and signal pad only when all of the resistive devices in the first set are electrically connected between the first voltage source and signal pad. The control circuit may include one or more additional sets of resistive devices programmably electrically connectable between the first voltage source and signal pad, whereby the controller programs in a binary incremental manner electrical connection of each of the additional sets of resistive devices between the first voltage source and signal pad only when all of the resistive devices in all of the previously programmed sets are electrically connected between the first voltage source and signal pad. The control circuit preferably includes at least one resistive device electrically connected between the first voltage source and signal pad at all times. In the preferred embodiment, the resistive devices are implemented with field effect transistors (FETs) and each set of resistive devices implements a resistive binary weighted code.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for increasing the sensitivity range of a variable impedance output driver control circuit is described in detail hereinafter. Although the invention is described in terms of specific illustrative embodiments, it is to be understood that the illustrative embodiments are shown by way of example only and the scope of the invention is not intended to be limited thereby.

Figure 1:
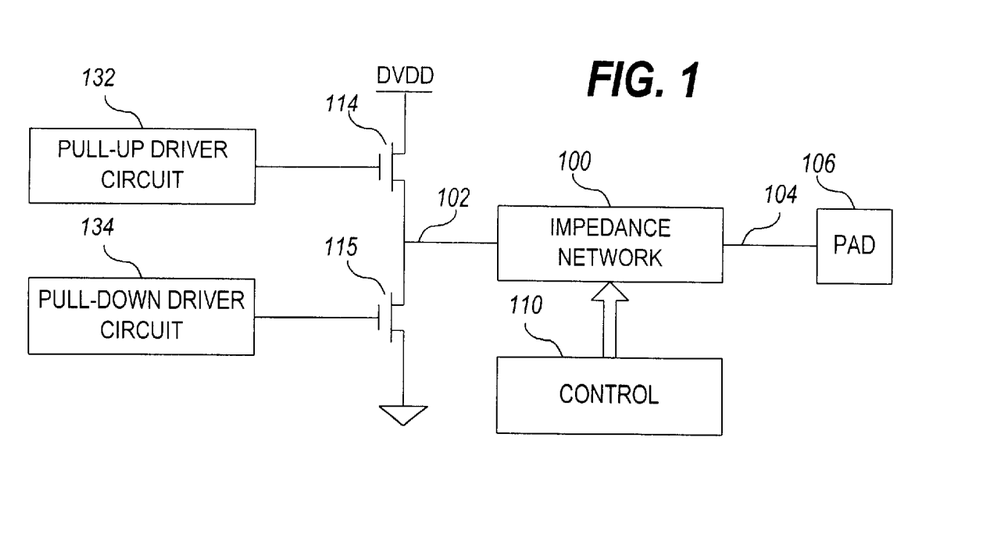
FIG. 1 is a schematic block diagram of a variable impedance output driver circuit.

Turning now to FIG. 1, there is shown a block diagram illustrating a driver circuit having a controllably variable output impedance. More specifically, the driver circuit includes a pull-up predriver circuit 132 and a pull-down predriver circuit 134. As is known, the pull-up predriver circuit 132 operates to drive an output value from a low state to a high state (e.g., logic zero to logic one), and the pull-down predriver circuit 134 operates to drive an output value from a high state to a low state. NFETs 114 and 115 are driven by the output of the pull-up predriver circuit 132 and the pull-down predriver circuit 134, respectively. The driver circuit output is that value seen on line 102, which is the electrical connection point between the drain node of NFET 114 and the source node of NFET 115. As will be further described in connection with FIG. 2, an impedance network 100 is interposed between the signal line 102 and the driver pad 106. The impedance network 100 provides a controllably variable impedance, which serves to vary the output impedance of the driver circuit to match the board trace impedance. The impedance provided by the impedance network 100 is controlled by control circuit 110. The output of the impedance network 100 is routed to the driver pad 106 via conductor 104.

Figure 2:
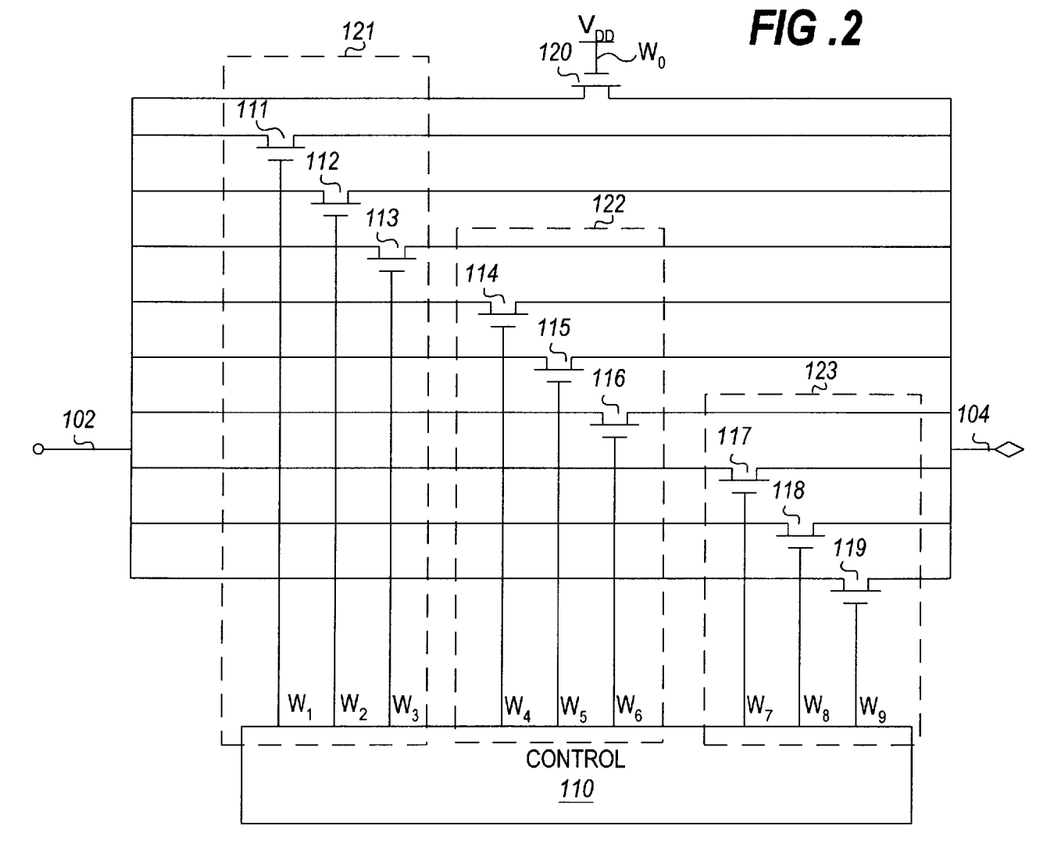
FIG. 2 is a schematic diagram of an impedance network implemented in accordance with the invention for the variable impedance output driver of FIG. 1.

To more particularly describe the structure and operation of the impedance network 100, reference is now made to FIG. 2, which illustrates this circuitry in more detail. Specifically, the impedance network 100 is shown in relation to the signal line 102, 104, and control circuit 110. The impedance network includes a plurality of resistive devices 111–120 electrically connected in parallel between the line 102 and line 104. In the preferred embodiment, the resistive devices 111–120 are implemented with field effect transistors (FETs), but could be implemented using other components such as a resistor in series with a switch. In the preferred embodiment, each of the FETs 111–120 is defined by a channel width that defines the admittance of that FET device. When activated (i.e., turned on to conduct current), each FET provides an electrical connection between line 102 and line 104 thereby allowing current flow and contributing to the combined parallel resistance of the impedance network. When more than one of the FET devices 111–120 is turned on, they act like resistors, combining in parallel to provide a lower resistance. In this way, the output impedance of the driver circuit may be varied.

In accordance with the invention, the resistive devices 111–119 are partitioned into a plurality of sets 121, 122, 123. In the embodiment of FIG. 2, set 121 includes resistive devices 111, 112, 113; set 122 includes resistive devices 114, 115, 116; set 123 includes resistive devices 117, 118, 119. Preferably, the first resistive device 111, 114, 117 in each set 121, 122, and 123, respectively, is characterized by an admittance of 10% of the combined admittance of all of the previous legs, and the resistive devices within each set are binary weighted to have admittance values that decrease by a factor of two. Therefore, the collective output of the control block 110 may serve as a digital calibration word $W_{1::9}$ to activate selected ones of the resistive devices 111–119 to precisely control the output impedance of the driver circuit in accordance with the method described hereinafter in FIG. 3. In the preferred embodiment, the bits 1::9 of the calibration word W correspond to the value driven on the gates of the corresponding FET devices 111–119. It will be appreciated that the circuitry or logic of the control block 110 will be dependent upon process, voltage, and temperature (PVT), but need not be described herein. The impedance network 100 is designed such that at least one path (namely, resistive device 120 in FIG. 2) is always activated to permit a signal to pass from signal line 102 to signal line 104 in order to prevent a spike in the output impedance seen on the signal pad 106 which may occur momentarily as a result of switching of the FET devices.

TABLE 3 illustrates an exemplary binary weighted thermometer code in accordance with the invention for a 9-bit output impedance calibration word W, where each bit position in TABLE 3 corresponds to a respective resistive device 111–119. When the bit position is shown in TABLE 3 as a "0", the corresponding resistive device is not connected and is therefore not included in the parallel resistance of the network. When the bit position is shown in TABLE 3 as a "1", the corresponding resistive device is connected and therefore does contribute to the combined parallel resistance of the network 100.

In accordance with the exemplary embodiment of the invention shown in FIG. 2, and as also illustrated in TABLE 3, the bit $W_0$ representing resistive device 120 is always activated (i.e., enabled to provide electrical connection between line 102 and 104). This leg defines the highest impedance in the slow PVT case.

Also in accordance with the exemplary embodiment of the invention shown in FIG. 2, the first partitioned set 121 includes resistive devices 111, 112, and 113 represented by bits $W_1$, $W_2$, $W_3$. The first resistive device 111 is characterized by an admittance $Y_1$ that is 10% the value of the admittance $Y_0$ of the resistive device 120 represented by bit $W_0$. (Said another way, the first resistive device 111 is characterized by an impedance $Z_1$ that is 10 times the impedance $Z_0$ of FET 120.) The admittances $Y_1$, $Y_2$, $Y_3$ of the resistive devices 111, 112, 113 in the first set 121 are weighted to implement a binary code, where resistive device FET 111 is sized to have an admittance $Y_1$, resistive device FET 112 is sized to have an admittance $Y_2=2*Y_1$, and resistive device FET 113 is sized to have an admittance $Y_3=4*Y_1$.

A second partitioned set 122 includes resistive devices 114, 115, and 116 represented by bits $W_4$, $W_5$, $W_6$. The first resistive device 114 in set 122 is characterized by an admittance $Y_4$ that is 10% the value of the combined admittances $Y_0$, $Y_1$, $Y_2$, $Y_3$ of the resistive devices 120, 111, 112, 113 represented by the previous bit positions $W_0$, $W_1$, $W_2$, $W_3$ The admittances $Y_4$, $Y_5$, $Y_6$ of the resistive devices 114, 115, 116 in the second set 122 are also weighted to implement a binary code, where resistive device FET 114 is sized to have an admittance $Y_4$, resistive device FET 115 is sized to have an admittance $Y_5=2*Y_4$, and resistive device FET 116 is sized to have an admittance $Y_6=4*Y_4$. When, and only when, all resistive devices 111, 112 and 113 in the first set 121 have been activated, may any of the resistive devices 114, 115 and 116 in the second set 122 be activated.

A third partitioned set 123 includes resistive devices 117, 118, and 119 represented by bits $W_7$, $W_8$, $W_9$. The first resistive device 117 in set 123 is characterized by an admittance $Y_7$ that is 10% the value of the combined admittances $Y_0$, $Y_1$, $Y_2$, $Y_3$, $Y_4$, $Y_5$, $Y_6$ of the resistive

TABLE 3

| $W_0$ | $W_1$ | $W_2$ | $W_3$ | $W_4$ | $W_5$ | $W_6$ | $W_7$ | $W_8$ | $W_9$ | Admittance (Y = 1/Z) | Impedance (Z) |
|---|---|---|---|---|---|---|---|---|---|---|---|
| 1 | 0 | 0 | 0 | 0 | 0 | 0 | 0 | 0 | 0 | 1 | 1 |
| 1 | 1 | 0 | 0 | 0 | 0 | 0 | 0 | 0 | 0 | 1 + .1 | .909 |
| 1 | 0 | 1 | 0 | 0 | 0 | 0 | 0 | 0 | 0 | 1 + .2 | .833 |
| 1 | 1 | 1 | 0 | 0 | 0 | 0 | 0 | 0 | 0 | 1 + .3 | .769 |
| 1 | 0 | 0 | 1 | 0 | 0 | 0 | 0 | 0 | 0 | 1 + .4 | .714 |
| 1 | 1 | 0 | 1 | 0 | 0 | 0 | 0 | 0 | 0 | 1 + .5 | .667 |
| 1 | 0 | 1 | 1 | 0 | 0 | 0 | 0 | 0 | 0 | 1 + .6 | .625 |
| 1 | 1 | 1 | 1 | 0 | 0 | 0 | 0 | 0 | 0 | 1 + .7 = 1.7 | .588 |
| 1 | 1 | 1 | 1 | 1 | 0 | 0 | 0 | 0 | 0 | (1 + .7)*1.1 = 1.87 | .535 |
| 1 | 1 | 1 | 1 | 0 | 1 | 0 | 0 | 0 | 0 | (1 + .7)*1.2 = 2.04 | .490 |
| 1 | 1 | 1 | 1 | 1 | 1 | 0 | 0 | 0 | 0 | (1 + .7)*1.3 = 2.21 | .452 |
| 1 | 1 | 1 | 1 | 0 | 0 | 1 | 0 | 0 | 0 | (1 + .7)*1.4 = 2.38 | .420 |
| 1 | 1 | 1 | 1 | 1 | 0 | 1 | 0 | 0 | 0 | (1 + .7)*1.5 = 2.55 | .392 |
| 1 | 1 | 1 | 1 | 0 | 1 | 1 | 0 | 0 | 0 | (1 + .7)*1.6 = 2.72 | .367 |
| 1 | 1 | 1 | 1 | 1 | 1 | 1 | 0 | 0 | 0 | (1 + .7)*1.7 = 2.89 | .346 |
| 1 | 1 | 1 | 1 | 1 | 1 | 1 | 1 | 0 | 0 | ((1 + .7)*1.7)*1.1 = 3.179 | .315 |
| 1 | 1 | 1 | 1 | 1 | 1 | 1 | 0 | 1 | 0 | ((1 + .7)*1.7)*1.2 = 3.468 | .288 |
| 1 | 1 | 1 | 1 | 1 | 1 | 1 | 1 | 1 | 0 | ((1 + .7)*1.7)*1.3 = 3.757 | .266 |
| 1 | 1 | 1 | 1 | 1 | 1 | 1 | 0 | 0 | 1 | ((1 + .7)*1.7)*1.4 = 4.046 | .247 |
| 1 | 1 | 1 | 1 | 1 | 1 | 1 | 1 | 0 | 1 | ((1 + .7)*1.7)*1.5 = 4.335 | .231 |
| 1 | 1 | 1 | 1 | 1 | 1 | 1 | 0 | 1 | 1 | ((1 + .7)*1.7)*1.6 = 4.624 | .216 |
| 1 | 1 | 1 | 1 | 1 | 1 | 1 | 1 | 1 | 1 | ((1 + .7)*1.7)*1.7 = 4.913 | .204 | devices 120, 111, 112, 113, 114, 115, 116 represented by the previous bit positions $W_0$, $W_1$, $W_2$, $W_3$, $W_4$, $W_5$, $W_6$. The admittances $Y_7$, $Y_8$, $Y_9$ of the resistive devices 117, 118, 119 in the third set 123 are also weighted to implement a binary code, where resistive device FET 117 is sized to have an admittance $Y_7$, resistive device FET 118 is sized to have an admittance $Y_8=2*Y_7$, and resistive device FET 119 is sized to have an admittance $Y_9=4*Y_7$. When, and only when, all resistive devices 111, 112, 113 in the first set 121 and all of the resistive devices 114, 115, 116 in the second set 122 have been activated, may any of the resistive devices 117, 118 and 119 in the third set 123 be activated.

It will be appreciated by those skilled in the art that the number of sets, the number of resistive devices in each partitioned set, and the weighting afforded to each of the resistive devices in each set, may vary according to a given design or application; however, the invention applies to and is intended to cover all such variations wherein each set of resistive devices is activated according to a thermometer code algorithm, while the resistive devices within each set are activated according to a pure binary code algorithm.

The novel hybrid binary weighted thermometer code approach to PVT variable output driver control significantly improves over the prior art by increasing the range and degree of sensitivity within the range of variable output impedance with fewer control lines. For example, in the implementation defined in TABLE 3, the controllable output impedance ranges from 1 to 0.204 times the impedance of the always-activated resistive device 120 (i.e., the maximum impedance in the Slow PVT case). The degree of sensitivity within the controllable output impedance range is also significantly higher.

Figure 3:
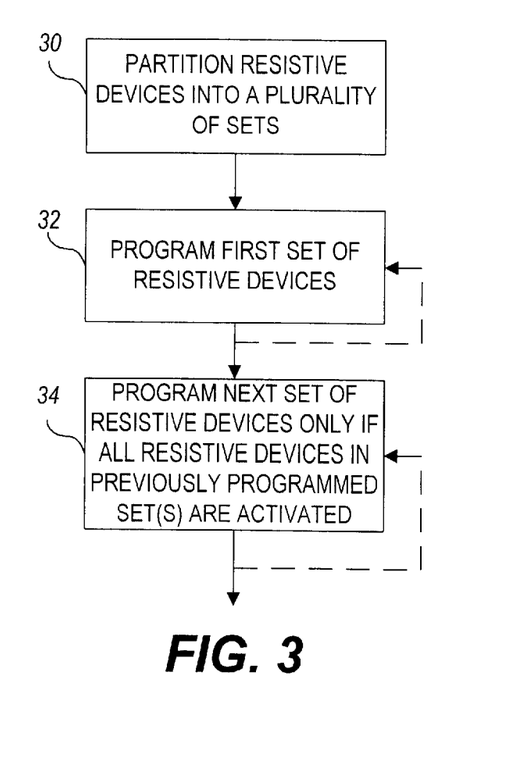
FIG. 3 is a flowchart of the method of the invention.

FIG. 3 is a flowchart illustrating the method of the invention. As illustrated, a plurality of resistive devices programmably connectable between the driver output and signal pad is partitioned 30 into a plurality of mutually exclusive sets. A first set of the resistive devices is programmed 32 such that zero or more of the resistive devices in the first set are electrically connected between the driver output and signal pad. The first set may be programmed more than once in order to obtain an output impedance value closest that of the transmission line impedance value. Preferably, if the first set of resistive devices is programmed more than once in a given calibration session, the reprogramming is performed in a step-by-step manner to reduce the amount of change in the output impedance seen on the output pad.

Only if all of the resistive devices in the first set are electrically connected between the driver output and signal pad is a next set of resistive devices selected from the remaining unprogrammed sets of resistive devices and programmed 34. Again, the selected next set of resistive devices may be programmed more than once in order to obtain an output impedance value closest that of the transmission line impedance value, and preferably, if the selected next set of resistive devices is programmed more than once in a given calibration session, the reprogramming is performed in a step-by-step manner to reduce the amount of change in the output impedance seen on the output pad.

Step 34 may be repeated for each remaining unprogrammed set of resistive devices until the output impedance of the output driver most closely matches that of the transmission line it drives.

Figure 4:
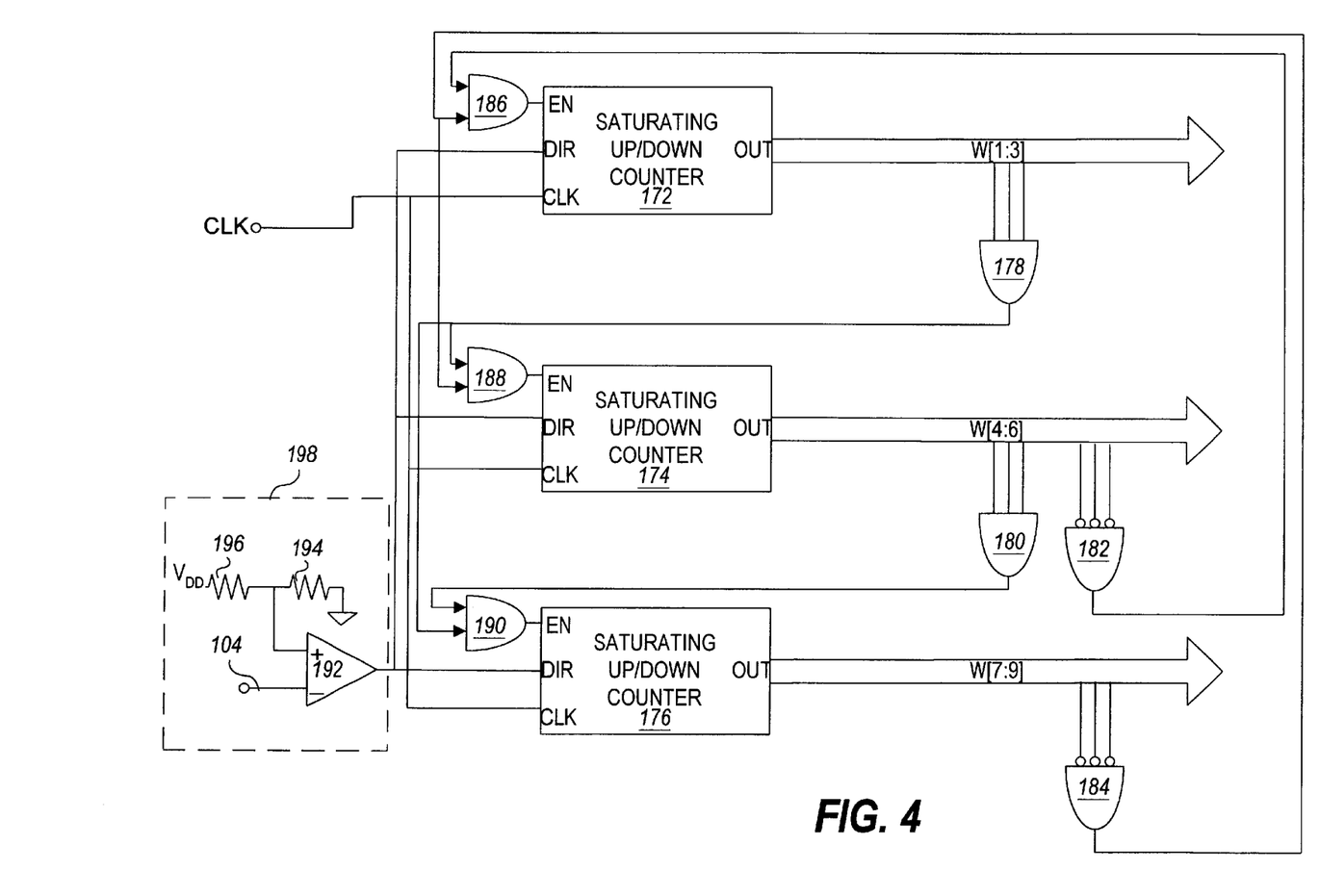
FIG. 4 is a schematic block diagram of an impedance network controller implemented in accordance with the invention.

FIG. 4 is a schematic block diagram of a controller 110 for programming the impedance network 100 of FIG. 2. As shown, controller 110 includes three 3-bit counters 172, 174, 176. Counters 172, 174, 176 are preferably saturating counters such that they do not roll over from the highest output to the lowest and visa-versa. Counters 172, 174, 176 increment or decrement the binary value on their respective outputs according to the directional state of input DIR when the clock input, CLK, is strobes. The outputs of counters 172, 174, 176 each respectively generate signals W[1:3], W[4:6], and W[7:9], each of which is used to drive the gate of one of the FETs in a respective set 121, 122, 123 in the impedance network 100.

Each counter 172, 174, 176 has an enable input EN which when asserted allows the counter to increment or decrement (depending on the state of the direction input DIR) once for each pulse of the clock input CLK. In order to implement a set-by-set thermometer code whereby all of the FETs in the higher-order-of-magnitude set must first be activated prior to programming the next lower order-of-magnitude set, and so on, each counter can only be enabled during certain portions of the programming process. In this example, the first counter 172 may only be enabled when none of the FETs belonging to the sets corresponding to the other counters are activated. In other words, bits W[4::9] output by counters 174 and 176 respectively must all have a value of "0". Accordingly, inverting input AND gates 182 and 184 respectively receive bits W[4:6] and W[7:9] from counters 174 and 176 respectively. The outputs of inverting input AND gates 182 and 184 feed the inputs of AND gate 186. The output of AND gate 186 feeds the enable input EN of counter 172. Accordingly, counter 172 is enabled only when bits W[4::9] are all "0".

Also in this example, counter 174 may only be enabled when all of the FETs in the first set 121 which are controlled by bits W[1:3] are activated and none of the FETs belonging to the third set 123 which are controlled by bits W[7:9] are activated. In other words, bits W[1:3] output by counter 172 must all have a value of "1" and bits W[7::9] output by counter 176 must all have a value of "0". Accordingly, AND gate 178 receives bits W[1:3] output by counter 172. The outputs of AND gate 178 and inverting input AND gate 184 feed the inputs of AND gate 188. Thus, counter 174 is enabled only when bits W[1:3] output by counter 172 are all "1" and W[7::9] output by counter 176 are all "0".

Also in this example, counter 176 may only be enabled when all of the FETs in both the first and second sets 121 and 122 which are controlled by bits W[1:3] and W[4:6] respectively are activated. In other words, bits W[1::6] output by counters 172 and 174 must all have a value of "1". Accordingly, AND gate 180 receives bits W[4:6] output by counter 174. The outputs of AND gates 178 and 180 feed the inputs of AND gate 190. Thus, counter 176 is enabled only when bits W[1::6] are all "1".

The direction input DIR is controlled by a comparator circuit 198. Line 104 at the output of the impedance network 100 is an input to the inverting terminal of analog comparator 192. The non-inverting input of analog comparator 192 is connected to a voltage divider formed with resistors 194 and 196. Resistors 194 and 196 may be on-chip resistors and are connected in series between the positive supply and the negative supply with the intermediate node connected to the non-inverting input of analog comparator 192. In one embodiment, resistors 194 and 196 have the same value so that the voltage at the non-inverting input of analog comparator 192 is VDD/2. The output of analog comparator 192 is connected to the DIR input of each of counters 172, 174, 176 which controls the direction that the counters count, if enabled.

When the inverting input of comparator 192 is lower than the non-inverting input of analog comparator 192, counters 172, 174, 176 count up (when enabled) to turn on more of the transistors of impedance network 100 to decrease the impedance of impedance network 100. This feedback system stabilizes when the impedance of impedance network 100 nearly matches the impedance of the load driven by the pad 106. Counters 172, 174, 176 count down when the inverting input of comparator 192 is higher than the non-inverting input of analog comparator 192. This turns off more of the transistors of impedance network 100 increasing the impedance of impedance network 100.

The circuit of FIG. 4 is provided merely as illustrative of how the control inputs for the impedance network 100 may be generated. The particular manner of generation of these signals does not form a limitation upon the invention. It will be appreciated, however, that the circuit of FIG. 4 allows the system to continuously update (via the comparators and up-down counters) the calibration control word, and therefore the output impedance of the output driver.

Figure 5:
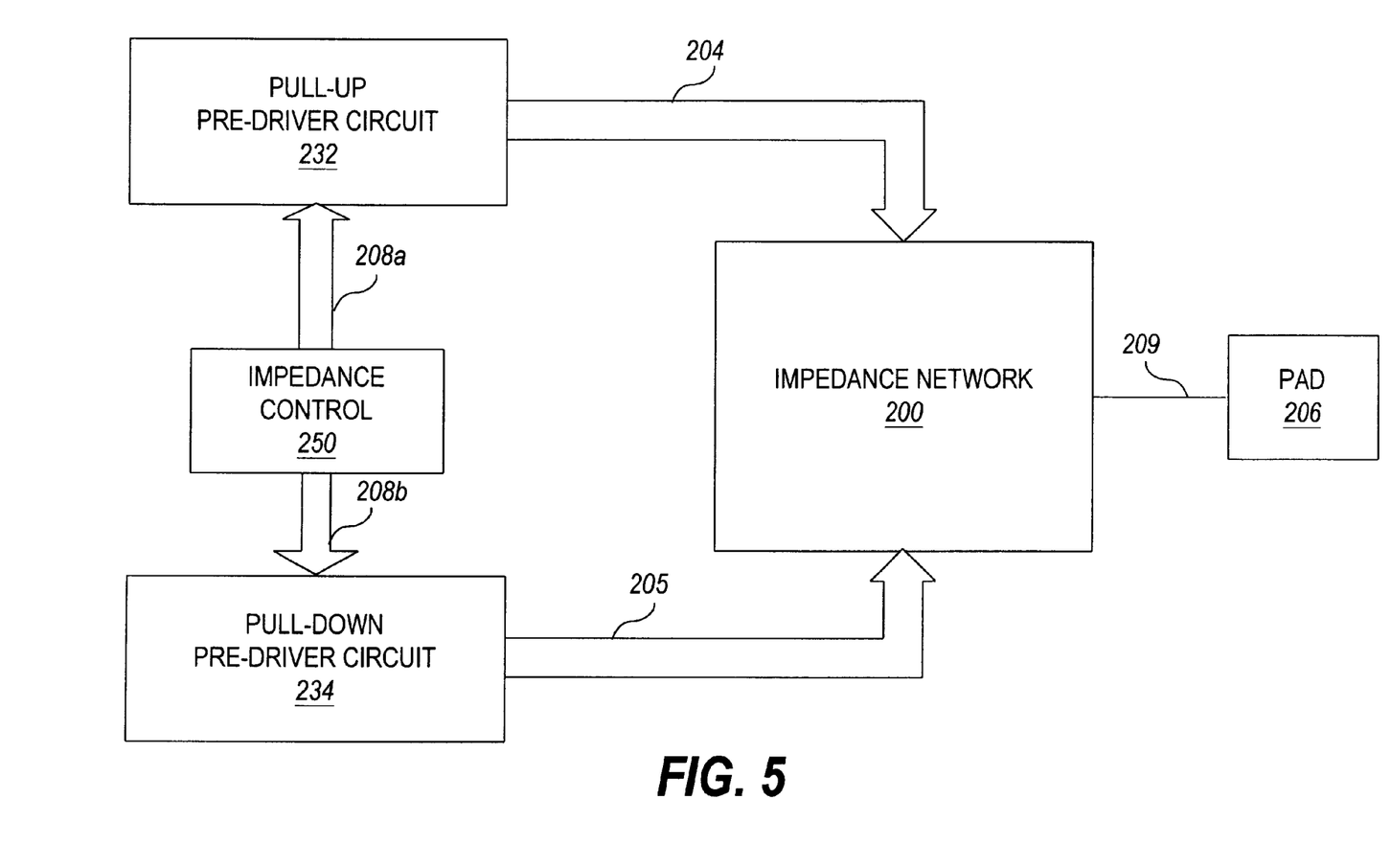
FIG. 5 is a block diagram of an alternative embodiment of a variable impedance output driver.

A block diagram of an alternative embodiment of the variable impedance output driver is shown in FIG. 5. In this embodiment, the driver circuit of the present invention operates in a driver circuit environment having a pull-up predriver circuit 232 and a pull-down predriver circuit 234. These circuits operate to driver an output signal from a low state to a high state and from a high state to a low state (or to a tri-state), respectfully. The outputs 204 and 205 of circuits 232 and 234 are directed to an output impedance network 200, which is constructed in accordance with the present invention. As illustrated in FIG. 5, the output 209 of the output impedance network 200 is directed to the signal pad 206. Also, an impedance control circuit 250 generates control signals 208a and 208b in the form of calibration words, which are used to control the operation of the output impedance network 200, in a manner as will be described below.

Figure 6:
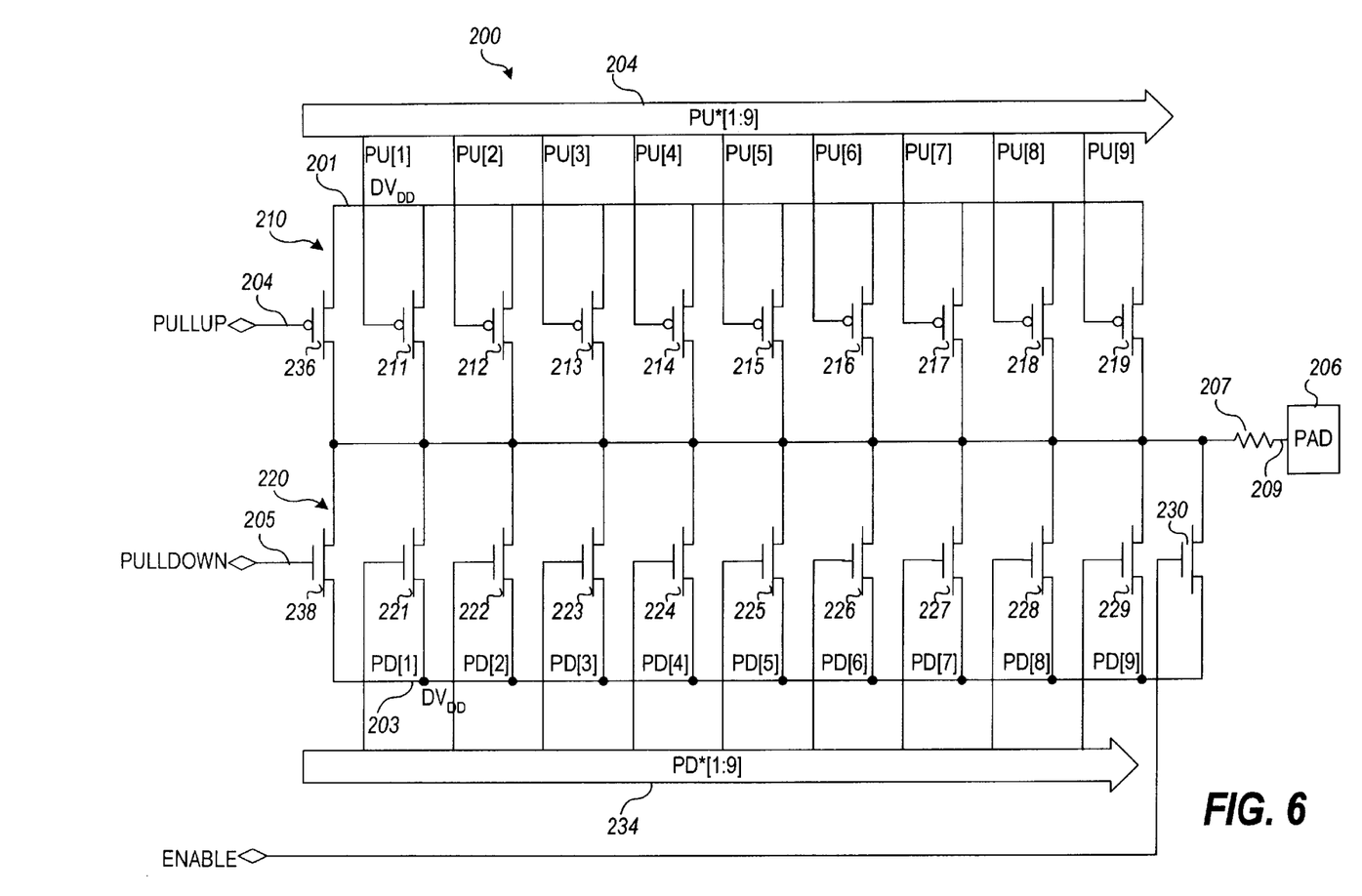
FIG. 6 is a schematic diagram of the variable impedance output driver of FIG. 5.

Reference is now made to FIG. 6 which illustrates, in detail, the preferred embodiment of the output impedance network 200 constructed in accordance with the present invention. In short, the impedance network 200 includes an array 210 of P-channel field effect transistors (PFETS) 236 and 211–219 which are electrically connected in parallel, such that the source node of each PFET is electrically connected with the source node of each other PFET and the drain node of each PFET is electrically connected with the drain node of each other PFET in the array 210. The network 200 further includes an array 220 of N-channel field effect transistors (NFETs), electrically connected such that the source nodes are electrically connected together and further connected to the drain nodes of the array 210 of PFETS, and the drain nodes are electrically connected together.

In accordance with the preferred embodiment, the PFET array 210 includes ten PFET devices 236, 211, 212, 213, 214, 215, 216, 217, 218, and 219. The source nodes of each of these PFET devices are electrically connected together on a common signal line 201 which is at a potential $DV_{DD}$. In similar fashion, the array 220 of NFET devices includes ten NFET devices 238, 221, 222, 223, 224, 225, 226, 227, 228, and 229. In addition, NFET device 230 may be provided at the output to lightly pull down an otherwise undriven output so that it does not float (as floating inputs are undesirable in CMOS devices). The drain nodes of each of the plurality of NFET devices are electrically connected together at line 203, which is at the potential $DV_{GND}$.

The PFET array 210 includes a first PFET 236 that is driven directly by the output 204 of the pull-up predriver circuit 232. Similarly, the NFET array 220 includes a first NFET device 238 that is driven by the output 205 of the pull-down predriver circuit 234. The remainder of the PFETS and NFETS in the two arrays are driven by control signals that are provided on busses 208a and 208b, designated by the label PU[9::1] and PD[9::1]. As will be illustrated and described in connection with FIG. 7, the control signals provided on lines 208a and 208b generate digital control words PU[9::1] (negative true) and PD[9::1] (positive true) that are used to selectively turn on and off the various PFET and NFET devices of the arrays 210 and 220 to effectively vary the output impedance of the driver circuit.

In accordance with the preferred embodiment, the PFET and NFET devices 211–219 and 221–229 in each of the PFET and NFET arrays 210 and 220 are partitioned into a plurality of sets 241, 242, 243 and 244, 245, 246 respectively. Preferably, each array 210 and 220 implements the binary weighted thermometer code shown in TABLE 3.

In particular, PFET array 210 includes a first partitioned set 241 comprising resistive devices 211, 212, and 213 represented by bits PU[1], PU[2] and PU[3]. The first resistive device 211 is characterized by an admittance $Y_1$ that is 10% the value of the admittance $Y_0$ of the resistive device 236. The admittances $Y_1$, $Y_2$, $Y_3$ of the resistive devices 211, 212, and 213 in the first set 241 are weighted to implement a binary code, where resistive device FET 211 is sized to have an admittance $Y_1$, resistive device FET 212 is sized to have an admittance $Y_2=2*Y_1$, and resistive device FET 213 is sized to have an admittance $Y_3=4*Y_1$.

A second partitioned set 242 includes resistive devices 214, 215, and 216 represented by bits PU[4], PU[5], and PU[6]. The resistance of the resistive devices 214, 215, and 216 in the second set 242 are also weighted to implement a binary code, where resistive device FET 214 is sized to have an admittance $Y_4$, resistive device FET 215 is sized to have an admittance $Y_5=2*Y_4$, and resistive device FET 216 is sized to have an admittance $Y_6=4*Y_4$. The resistive device FET 214 represented by bit PU[4] is sized to have an admittance of 10% of that of the combined admittance of activated resistive devices 236, 211, 212, and 213. When, and only when, all resistive devices 211, 212 and 213 in the first set 241 have been activated, may the resistive devices 214, 215 and 216 in the second set 242 be activated according to a binary increment.

A third partitioned set 243 includes resistive devices 217, 218, and 219 represented by bits PU[7], PU[8], and PU[9]. The admittances of the resistive devices 217, 218, and 219 in the third set 243 are also weighted to implement a binary code, where resistive device FET 217 is sized to have an admittance $Y_7$, resistive device FET 218 is sized to have an admittance $2*Y_8$, and resistive device FET 219 is sized to have an admittance $4*Y_9$. The resistive device FET 217 represented by bit PU[7] is sized to have a resistance of 10% of that of the combined resistance of activated resistive devices 211, 212, 213, 214, 215, and 216. When, and only when, all resistive devices 211, 212 and 213 in the first set 241 and all of the resistive devices 214, 215, and 216 in the second set 242 have been activated, may the resistive devices 217, 218, and 219 in the third set 243 be activated according to a binary increment.

NFET array 220 operates according to the same principles as PFET array 210, implementing the binary weighted thermometer code of TABLE 3, but using NFETs coupled to $VD_{GND}$, to pull down the output pad.

It will be appreciated by those skilled in the art that the number of sets, the number of resistive devices in each partitioned set, and the weight afforded to each of the resistive devices in each set, may vary according to a given design or application; however, the invention applies to and is intended to cover all such variations wherein each set of resistive devices is activated according to a thermometer code algorithm, while the resistive devices within each set are activated according to a pure binary code algorithm.

TABLE 4 is provided below which specifies the physical size (as drawn) of the various transistors illustrated in FIG. 6, in accordance with the preffered embodiment of the present invention. It should be appreciated, however, that the invention is not limited to the values set forth in the table, but that the table is provided merely to fully disclose the preferred embodiment of the present invention.

TABLE 4

| Reference Numeral | Length (microns) | Width (microns) |
| --- | --- | --- |
| 236 | .44 | 80 |
| 211 | .44 | 8 |
| 212 | .44 | 16 |
| 213 | .44 | 32 |
| 214 | .44 | 13.6 |
| 215 | .44 | 27.2 |
| 216 | .44 | 54.4 |
| 217 | .44 | 23.12 |
| 218 | .44 | 46.24 |
| 219 | .44 | 92.48 |
| 238 | .44 | 20 |
| 221 | .44 | 2 |
| 222 | .44 | 4 |
| 223 | .44 | 8 |
| 224 | .44 | 3.4 |
| 225 | .44 | 6.8 |
| 226 | .44 | 13.6 |
| 227 | .44 | 5.78 |
| 228 | .44 | 10.56 |
| 229 | .44 | 21.12 | consistent with the concepts and teachings of the present invention, the control 250 (FIG. 6) may be implemented in a variety of ways. What is important for purposes of the inventive concepts is that the control circuit 250 controls the state of the various PFETs in the FET array 200 to vary the output impedance of the driver circuits so that the output resistance remains substantially equals the load impedance over various ranges of the process, voltage, and temperature. Various structures and circuits may be implemented to achieve this broad goal, and FIG. 7 illustrates just one such circuit.

Figure 7:
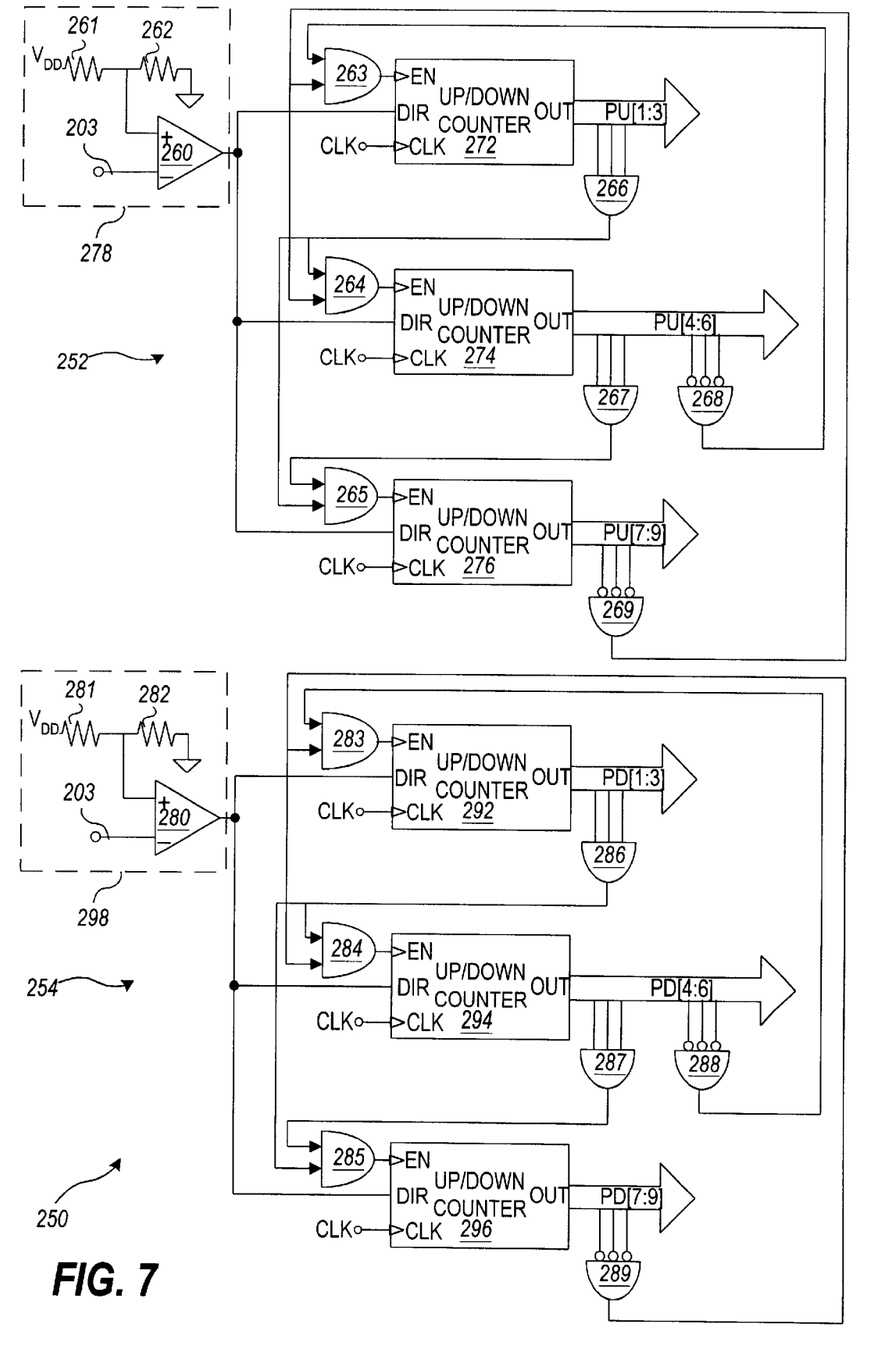
FIG. 7 is a schematic block diagram of an impedance network controller for controlling the impedance of the variable impedance output driver of FIG. 6.

Referring now to FIG. 7, two sets of control signals are produced (one for the pull-up transistors, one for the pull-down transistors) that can be used to program a group of output driver's impedances to match, or be some multiple of an external resistor. During normal operation, a calibration driver PFET array 210 has current flowing through it. Current flows from positive supply $DV_{DD}$ through PFET array 210, through electrostatic discharge (ESD) protection resistor 207, out pad 206, through an external resistor (not shown) to ground.

Control circuit 250 includes pullup control circuitry 252 and pulldown control circuitry 254, which each respectively generate the pullup control word PU[1:9] and pulldown control word PD[1:9] that respectively control the PFET array 210 and NFET array 220.

Pullup control circuitry 252 includes a counter 272, 274, 276 for each set 241, 242, 243 of PFETs in the PFET array 210. Counters 272, 274, and 276 are saturating counters such that they do not roll over from the highest output to the lowest and visa-versa. Counters 272, 274, 276 increment or decrement the binary value on their respective outputs according to the directional state of input $DIR_{PU}$ when the clock input, CLK, is strobes. The outputs of counters 272, 274, and 276 each respectively generate signals PU[1:3], PU[4:6], and PU[7:9], each of which is used to drive the gate of one of the FETs in a respective set 241, 242, 243 in the PFET array 210.

Each counter 272, 274, 276 has an enable input EN which when asserted allows the counter to increment or decrement (depending on the state of the direction input $DIR_{PU}$) once for each pulse of the clock input CLK. In order to implement a set-by-set thermometer code whereby all of the PFETs in the first set must first be activated prior to programming the next lower set, and so on, each counter can only be enabled during certain portions of the programming process. In this example, counter 272 may only be enabled when none of the PFETs belonging to the sets 242, 243 corresponding to the other counters 274, 276 are activated. In other words, bits PU[4::9] output by counters 274 and 276 respectively must all have a value of "0". Accordingly, inverting input AND gates 268 and 269 respectively receive bits PU[4:6] and PU[7:9] from counters 274 and 276 respectively. The outputs of inverting input AND gates 268, 269 feed the inputs of AND gate 263. The output of AND gate 263 feeds the enable input EN of counter 272. Accordingly, counter 272 is enabled only when bits PU[4::9] are all "0".

Counter 274 may only be enabled when all of the PFETs in set 241 which are controlled by bits PU[1:3] are activated and none of the PFETs belonging to set 243 which are controlled by bits PU[7:9] are activated. In other words, bits PU[1:3] output by counter 272 must all have a value of "1"and bits PU[7::9] output by counter 276 must all have a value of "0". Accordingly, AND gate 266 receives bits PU[1:3] output by counter 272. The outputs of AND gate 266 and inverting input AND gate 269 feed the inputs of AND gate 264. Thus, counter 274 is enabled only when bits PU[1:3] output by counter 272 are all "1" and PU[7::9] output by counter 276 are all "0".

Counter 276 may only be enabled when all of the FETs in sets 241 and 242 which are controlled by bits PU[1:3] and PU[4:6] respectively are activated. In other words, bits PU[1::6] output by counters 272 and 274 must all have a value of "1". Accordingly, AND gate 267 receives bits PU[4:6] output by counter 274. The outputs of AND gates 266 and 267 feed the inputs of AND gate 265. Thus, counter 276 is enabled only when bits PU[1::6] are all "1".

The direction input $DIR_{PU}$ of each counter 272, 274, 276 is controlled by a comparator circuit 278. The impedances of the PFET array 210 and the ESD protection resistor 207 form a voltage divider with the external resistor (not shown) to divide down the positive supply voltage at the pad 206 node. This node is an input to the inverting terminal of analog comparator 260. The non-inverting input of analog comparator 260 is connected to a voltage divider formed with resistors 261 and 262. Resistors 261 and 262 may be on-chip resistors and are connected in series between the positive supply and the negative supply with the intermediate node connected to the non-inverting input of analog comparator 260. In one embodiment, resistors 261 and 262 have the same value so that the voltage at the non-inverting input of analog comparator 260 is $V_{DD}/2$. The output of analog comparator 260 is connected to the $DIR_{PU}$ input of digital up/down counters 272, 274, 276 which controls the direction that up/down counters 272, 274, and 276 count, if enabled, in the PFET array 210.

When the inverting input of comparator 260 is lower than the non-inverting inverting input of analog comparator 260, counters 272, 274, 276 count up (when enabled) to turn on more of the transistors of PFET array 210 to decrease the impedance of pullup impedance network (PFET array 210). This feedback system stabilizes when the impedance of PFET array 210 nearly matches the impedance of the load driven by the pad 206. Counters 272, 274, 276 count down when the inverting input of comparator 260 is higher than the non-inverting input of analog comparator 260. This turns off more of the transistors of PFET array 210 increasing the impedance of pullup impedance network.

Pulldown control circuitry 254 includes a counter 292, 294, 296 for each set 244, 245, 246 of NFETs in the NFET array 220. Counters 292, 294, 296 are saturating counters such that they do not roll over from the highest output to the lowest and visa-versa. Counters 292, 294, 296 increment or decrement the binary value on their respective outputs according to the directional state of input $DIR_{PD}$ when the clock input, CLK, is strobes. The outputs of counters 272, 274, and 276 each respectively generate signals PD[1:3], PD [4:6], and PD [7:9], each of which is used to drive the gate of one of the FETs in a respective set 244, 245, 246 in the NFET array 220.

The operation of the pulldown control circuit 254 is similar to the operation of pullup control circuit 252, whereby control logic implemented by AND gates 283, 284, 285, 286, 287, 288, and 289 control the enable input of each counter 292, 294, 296, and comparator circuit 298 (comprising resistors 281 and 282 forming a voltage divider that feeds the non-inverting input of comparator 280) control the direction input $DIR_{PD}$ of each counter 292, 294, 296. The pulldown control circuit 254 controls the impedance of the pulldown NFET array 220, generating the pulldown impedance control word PD[1::9].

Again, and as previously mentioned, the circuit of FIG. 7 is provided merely as illustrative of how the control inputs for the impedance network PFET and NFET arrays 210, 220 may be generated, and the particular manner of generation of these signals does not form a limitation upon the invention. It will be appreciated, however, that the circuit of FIG. 7 allows the system to continuously update (via the comparators and up-down counters) the calibration control words, and therefore the output impedance of the output driver.

The foregoing description has been presented for purposes of illustration and description. It is not intended to be exhaustive or to limit the invention to the precise forms disclosed. Obvious modifications or variations are possible in light of the above teachings. For example, it will be appreciated that the number of sets 241–246 and/or number of FETs in each set may be increased or decreased according to the needs of the application.

It will also be appreciated that the calibration words 208a and 208b (illustrated herein as nine bit words) may be of differing size, either fewer or greater than nine bits.

It will also be appreciated that having separate and independent calibration words for the pull-up and pull-down FETs enables the output driver to offer precision impedance matching over various process, voltage, and temperature ranges.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for variably adjusting an output impedance of an output driver circuit that is configured to drive a signal onto a node using an output driver control circuit comprising a plurality of resistive devices each of which is programmably electrically connectable in parallel between a first voltage source and said node, comprising:

programming in a binary incremental manner electrical connection of a first set of said resistive devices between said first voltage source and said node;

programming in a binary incremental manner electrical connection of a second set of said resistive devices between said first voltage source and said node only if all of said resistive devices in said first set are enabled.

2. A method in accordance with claim 1, wherein:

said plurality of resistive devices in said first set implement a resistive binary weighted code; and said plurality of resistive devices in said second set implement a resistive binary weighted code.

3. A method in accordance with claim 1, comprising:

electrically connecting at least one resistive device between said first voltage source and said node at all times.

4. A method in accordance with claim 1, comprising:

programming in a binary incremental manner electrical connection of one or more additional sets of said resistive devices between said first voltage source and said node only if all of said resistive devices in said previously programmed sets are enabled.

5. A method in accordance with claim 4, wherein:

said plurality of resistive devices in said first set implement a resistive binary weighted code; and said plurality of resistive devices in said second set implement a resistive binary weighted code; and said plurality of resistive devices in at least one of said one or more additional sets implement a resistive binary weighted code.

6. A method in accordance with claim 4, comprising:

electrically connecting at least one resistive device between said first voltage source and said node at all times.

7. A control circuit for a variable impedance output driver circuit that is configured to drive a signal onto a node, comprising:

a first set of resistive devices programmably electrically connectable between a first voltage source and said node;

a second set of resistive devices programmably electrically connectable between said first voltage source and said node; and a controller which programs in a binary incremental manner electrical connection of said first set of resistive devices between said first voltage source and said node and which programs in a binary incremental manner electrical connection of a second set of resistive devices between said first voltage source and said node only if all of said resistive devices in said first set are electrically connected between said first voltage source and said node.

8. A control circuit in accordance with claim 7, wherein:

said resistive devices in said first set implement a resistive binary weighted code.

9. A control circuit in accordance with claim 8, wherein:

said resistive devices in said second set implement a-resistive binary weighted code.

10. A control circuit in accordance with claim 7, comprising:
   at least one resistive device electrically connected between said first voltage source and said node at all times.

11. A control circuit in accordance with claim 7, wherein:
   each of said resistive devices in said first set and said second set comprise field effect transistors (FETs).

12. A control circuit in accordance with claim 7, comprising:
   one or more additional sets of resistive devices programmably electrically connectable between said first voltage source and said node;
   wherein said controller programs in a binary incremental manner electrical connection of at least one of said one or more additional sets of resistive devices between said first voltage source and said node only if all of said resistive devices in said previously programmed sets are electrically connected between said first voltage source and said node.

13. A control circuit in accordance with claim 12, wherein:
   said resistive devices in said first set implement a resistive binary weighted code.

14. A control circuit in accordance with claim 13, wherein:
   said resistive devices in said second set implement a resistive binary weighted code.

15. A control circuit in accordance with claim 14, wherein:
   said resistive devices in at least one of said one or more additional sets implement a resistive binary weighted code.

16. A control circuit in accordance with claim 12, comprising:
   at least one resistive device electrically connected between said first voltage source and said node at all times.

17. A control circuit in accordance with claim 12, wherein:
   each of said resistive devices in said first set, said second set, and said one or more additional sets comprise field effect transistors (FETs).

* * * * *